(12) United States Patent
Aniruddhan et al.

(10) Patent No.: US 8,599,938 B2
(45) Date of Patent: Dec. 3, 2013

(54) LINEAR AND POLAR DUAL MODE TRANSMITTER CIRCUIT

(75) Inventors: Sankaran Aniruddhan, San Diego, CA (US); Chiewcharn Narathong, Laguna Niguel, CA (US); Ravi Sridhara, San Diego, CA (US); Babak Nejati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 937 days.

(21) Appl. No.: 12/277,913

(22) Filed: Nov. 25, 2008

(65) Prior Publication Data

US 2009/0190692 A1  Jul. 30, 2009

Related U.S. Application Data

(63) Continuation-in-part of application No. 12/209,164, filed on Sep. 11, 2008, and a continuation-in-part of application No. 11/855,997, filed on Sep. 14, 2007, now Pat. No. 8,019,310, and a continuation-in-part of application No. 11/955,201, filed on Dec. 12, 2007, now Pat. No. 7,941,115.

(60) Provisional application No. 60/983,879, filed on Oct. 30, 2007.

(51) Int. Cl.
  *H04L 27/00*  (2006.01)
(52) U.S. Cl.
  USPC ............................ 375/259; 375/261; 375/298
(58) Field of Classification Search
  USPC ................... 375/259, 261, 268, 298, 300
  See application file for complete search history.

(56) References Cited

U.S. PATENT DOCUMENTS 3,212,024 A  10/1965  King, Jr.
3,212,027 A  10/1965  Ko
(Continued)

FOREIGN PATENT DOCUMENTS

CN  1207835 A  2/1999
CN  1726649 A  1/2006
(Continued)

OTHER PUBLICATIONS

Farbod Behbahani et al: "A 2.4-GHz Low-IF Receiver for Wideband WLAN in 0.6-m CMOS-Architecture and Front-End" IEEE Journal of Solid-State Circuits, IEEE Service Center, Piscataway, NJ, US, vol. 35, No. 12, pp. 1908-19161 Dec. 2000 (Dec. 1, 2000), XP011061384 ISSN: 0018-9200 section IV B figure 8a.

(Continued)

*Primary Examiner* — Jean B Corrielus
(74) *Attorney, Agent, or Firm* — Eric Ho (57) ABSTRACT

Method and apparatus for configuring a transmitter circuit to support linear or polar mode. In the linear mode, a baseband signal is specified by adjusting the amplitudes of in-phase (I) and quadrature (Q) signals, while in the polar mode, the information signal is specified by adjusting the phase of a local oscillator (LO) signal and the amplitude of either an I or a Q signal. In an exemplary embodiment, two mixers are provided for both linear and polar mode, with a set of switches selecting the appropriate input signals provided to one of the mixers based on whether the device is operating in linear or polar mode. In an exemplary embodiment, each mixer may be implemented using a scalable architecture that efficiently adjusts mixer size based on required transmit power.

23 Claims, 7 Drawing Sheets

(56) References Cited

U.S. PATENT DOCUMENTS

| | | | |
|---|---|---|---|
| 5,469,105 A * | 11/1995 | Sparks | 330/129 |
| 5,841,326 A | 11/1998 | Kitazono et al. | |
| 5,930,696 A | 7/1999 | Tzuang et al. | |
| 5,966,666 A | 10/1999 | Yamaguchi et al. | |
| 6,016,422 A | 1/2000 | Bartusiak | |
| 6,259,301 B1 | 7/2001 | Gailus et al. | |
| 6,266,517 B1 | 7/2001 | Fitzpatrick et al. | |
| 6,307,894 B2 | 10/2001 | Eidson et al. | |
| 6,356,746 B1 | 3/2002 | Katayama | |
| 6,487,398 B1 | 11/2002 | Nobbe et al. | |
| 6,590,438 B1 | 7/2003 | Manku et al. | |
| 6,906,996 B2 | 6/2005 | Ballantyne | |
| 6,985,033 B1 | 1/2006 | Shirali et al. | |
| 7,023,275 B2 | 4/2006 | Miyamoto | |
| 7,027,833 B1 | 4/2006 | Goodman | |
| 7,076,231 B2 | 7/2006 | Yamawaki et al. | |
| 7,092,676 B2 | 8/2006 | Abdelgany et al. | |
| 7,102,411 B2 | 9/2006 | Behzad | |
| 7,120,413 B2 | 10/2006 | Lee et al. | |
| 7,139,547 B2 | 11/2006 | Wakayama et al. | |
| 7,151,919 B2 | 12/2006 | Takalo et al. | |
| 7,236,212 B2 | 6/2007 | Carr et al. | |
| 7,277,689 B2 | 10/2007 | Simon | |
| 7,280,805 B2 | 10/2007 | Xu et al. | |
| 7,392,026 B2 | 6/2008 | Alam et al. | |
| 7,457,605 B2 | 11/2008 | Thompson et al. | |
| 7,460,844 B2 | 12/2008 | Molnar et al. | |
| 7,468,629 B2 | 12/2008 | Chien | |
| 7,573,347 B2 | 8/2009 | Mayer et al. | |
| 7,603,094 B2 | 10/2009 | Rahman et al. | |
| 7,693,496 B2 * | 4/2010 | Lewis | 455/108 |
| 7,702,359 B2 | 4/2010 | Tanaka et al. | |
| 7,729,681 B2 | 6/2010 | Someya | |
| 7,750,749 B2 | 7/2010 | Jones | |
| 7,778,613 B2 | 8/2010 | Seendripu et al. | |
| 7,853,212 B2 * | 12/2010 | van Waasen | 455/42 |
| 7,894,790 B2 | 2/2011 | Gomez et al. | |
| 7,899,426 B2 | 3/2011 | Tasic et al. | |
| 7,941,115 B2 | 5/2011 | Aniruddhan et al. | |
| 7,974,356 B2 * | 7/2011 | Rofougaran | 375/260 |
| 8,019,310 B2 | 9/2011 | Sahota et al. | |
| 2002/0167369 A1 | 11/2002 | Yamaji et al. | |
| 2003/0155959 A1 | 8/2003 | Belot et al. | |
| 2004/0071225 A1 | 4/2004 | Suzuki et al. | |
| 2004/0127172 A1 | 7/2004 | Gierkink et al. | |
| 2004/0137862 A1 | 7/2004 | Tanaka et al. | |
| 2004/0253939 A1 * | 12/2004 | Castaneda et al. | 455/341 |
| 2005/0107055 A1 | 5/2005 | Bult et al. | |
| 2005/0117664 A1 | 6/2005 | Adan et al. | |
| 2005/0191976 A1 * | 9/2005 | Shakeshaft et al. | 455/118 |
| 2005/0220217 A1 | 10/2005 | Yamawaki et al. | |
| 2005/0282512 A1 | 12/2005 | Yu | |
| 2006/0038710 A1 | 2/2006 | Staszewski et al. | |
| 2006/0068746 A1 | 3/2006 | Feng et al. | |
| 2006/0119493 A1 | 6/2006 | Tal et al. | |
| 2006/0246862 A1 | 11/2006 | Agarwal et al. | |
| 2006/0261907 A1 * | 11/2006 | Efstathiou et al. | 332/106 |
| 2007/0015472 A1 * | 1/2007 | Murtojarvi et al. | 455/102 |
| 2007/0072558 A1 * | 3/2007 | Sridharan et al. | 455/86 |
| 2007/0096980 A1 * | 5/2007 | Gradincic et al. | 342/357.06 |
| 2007/0111697 A1 | 5/2007 | Bellantoni | |
| 2007/0142000 A1 * | 6/2007 | Herzinger | 455/91 |
| 2007/0238431 A1 | 10/2007 | Zhan et al. | |
| 2007/0247212 A1 | 10/2007 | Zhang | |
| 2007/0298750 A1 | 12/2007 | Masuda | |
| 2008/0014896 A1 | 1/2008 | Zhuo et al. | |
| 2008/0125060 A1 | 5/2008 | Lin et al. | |
| 2009/0023413 A1 | 1/2009 | Xu et al. | |
| 2009/0075620 A1 | 3/2009 | Aniruddhan et al. | |
| 2009/0191825 A1 * | 7/2009 | Georgantas et al. | 455/102 |
| 2009/0239592 A1 | 9/2009 | Deng et al. | |
| 2009/0252252 A1 | 10/2009 | Kim et al. | |
| 2010/0029323 A1 | 2/2010 | Tasic et al. | |
| 2010/0190453 A1 * | 7/2010 | Rofougaran et al. | 455/75 |

FOREIGN PATENT DOCUMENTS

| | | |
|---|---|---|
| CN | 1904773 A | 1/2007 |
| EP | 0276130 A2 | 7/1988 |
| EP | 1521376 | 4/2005 |
| EP | 1760877 A1 | 3/2007 |
| EP | 1833161 | 9/2007 |
| JP | 6165624 | 4/1986 |
| JP | 7202677 A | 8/1995 |
| JP | 2000022575 A | 1/2000 |
| JP | 2000503826 | 3/2000 |
| JP | 2003032048 A | 1/2003 |
| JP | 2003188754 A | 7/2003 |
| JP | 2004289812 A | 10/2004 |
| JP | 2005136830 A | 5/2005 |
| JP | 2005184608 A | 7/2005 |
| JP | 2005244397 A | 9/2005 |
| JP | 2005294902 A | 10/2005 |
| JP | 2006014293 A | 1/2006 |
| JP | 2006114965 A | 4/2006 |
| JP | 2007074121 A | 3/2007 |
| JP | 3979237 B2 | 9/2007 |
| JP | 2008160327 A | 7/2008 |
| KR | 19990081842 | 11/1999 |
| TW | 566011 B | 12/2003 |
| TW | 200711312 | 3/2007 |
| TW | 200743336 | 11/2007 |
| TW | 200812308 A | 3/2008 |
| TW | 200822581 A | 5/2008 |
| WO | 9726710 | 7/1997 |
| WO | WO2006002945 | 1/2006 |
| WO | WO2006117589 | 11/2006 |
| WO | 2007053365 | 5/2007 |
| WO | WO2008008759 | 1/2008 |

OTHER PUBLICATIONS

International Search Report and Written Opinion—PCT/US2009/065962, International Search Authority—European Patent Office—Jun. 8, 2010.

Kim, Bonkee et al: "A 2.6 V GSM/PCN Dual Band Variable Gain Low Noise RF Down Conversion Mixer" 2002 IEEE Radio Frequency Integrated Circuits Symposium, 2002, pp. 137-140, XP002508867 sections II and III figures 1-3.

Mayer C et al: "A Robust GSM/EDGE Transmitter Using Polar Modulation Techniques" Wireless Technology, 2005. The European Conference on CNIT La Defense, Paris Oct. 3-4, 2005, Piscataway, NJ, USA,IEEE LNKDDOI: 10.1109/ECWT.2005.1617663, Oct. 3, 2005 pp. 103-106, XP010908871 ISBN: 978-2-9600551-1-5 figure 2.

McCune E Ed—Maxim A: "Polar modulation and bipolar RF power devices" Bipolar/BiCMOS Circuits and Technology Meeting, 2005. Proceedings of the, IEEE, Piscataway, NJ, USA LNKDDOI: 10.1109/BIPOL.2005.1555188, Oct. 9, 2005, pp. 1-5, XP010861821 ISBN: 978-0-7803-9309-7 figure 2.

Ziv R et al: "A phase correction technique applied to 700MHz a 6GHz complex demodulators in multi-band wireless systems" Microwaves, Communications, Antennas and Electronic Systems, 2008. C0MCAS 2008. IEEE International Conference on, IEEE, Piscataway, NJ, USA, May 13, 2008, pp. 1-8, XP031285366 ISBN: 978-1-4244-2097-1 the whole document.

Brenna G et al: "A 2GHz Carrier Leakage Calibrated Direct-Conversion WCDMA Transmitter in 0.13-<tex> $muhboxm$,/tex.CMOS" IEEE Hournal of Solid-State Circuits, IEEE vol. 39, No. 8, Aug. 1, 2004, pp. 1253-1262, XP011115212.

International Search Report—PCT/US08/076321, International Search Authority—European Patent Office—Jan. 7, 2009.

Written Opinion—PCT/US08/076321, International Search Authority—European Patent Office—Jan. 7, 2009.

International Search Report—PCT/US08/076324, International Search Authority—European Patent Office—Jan. 7, 2009.

Written Opinion—PCT/US08/076324, International Search Authority—European Patent Office—Jan. 7, 2009.

Bagheri, Rahim, "An 800-MHz-6-GHz Software-Defined Wireless Receiver in 90-nm CMOS," IEEE Journal of Solid-state Circuits, vol. 41, No. 12, Dec. 2006.

(56) References Cited

OTHER PUBLICATIONS

Circa R et al: "Resistive MOSFET mixer for mobile direct conversion receivers" Microwave and Optoelectronics Conference, 2003. IMOC 2003. Proceedings of the 2003 SBMO/IEEE MTT-S International Sep. 20-23, 2003, Piscataway, NJ, USA,IEEE, US, vol. 3, Sep. 20, 2003, pp. 59-64, XP010687639 ISBN: 978-0-7803-7824-7 the whole document.

Kim, K et al.: "A resistively degenerated wide-band passive mixer with low niose figure and +60dBm IIP2 in 0.18¼ m CMOS" Radio Frequency Integrated Circuits Symposium, 2008. RFIC 2008, IEEE Piscataway, NJ, US, Jun. 17, 2008, pp. 185-188. ISBN: 978-1-4244-1808-4.

Nguyen et al., "A Low-Power RF Direct-Conversion Receiver/Transmitter for 2.4-GHz-Band IEEE 802.15.4 Standard in 0.18-.mu.m CMOS Technology," vol. 54, No. 12, Dec. 2006, pp. 4062-4071.

Razavi B et al: "Multiband UWB transceivers" Custom Integrated Circuits Conference, 2005. Proceedings of the IEEE 2005, IEEE, Piscataway, NJ, USA, Sep. 18, 2005, pp. 140-147, XP010873764 ISBN: 978-0-7803-9023-2 the whole document.

Translation of Office Action in Japan application 2010-525056 corresponding to U.S. Appl. No. 11/855,997, citing WO2007053365A1 and JP2005184608 dated Feb. 22, 2011.

Translation of Office Action in Korean application 10-2010-7008070 corresponding to U.S. Appl. No. 12/209,164, citing WO2007053365 and KR19990081842 dated Apr. 29, 2011.

Translation of Office Action in Korean application 2010-7008071 corresponding to U.S. Appl. No. 12/209,164, citing KR19990081842 and KIM_BONKEE_ET_AL_A_2_6_V_GSM_PCN_year_2002 dated Apr. 29, 2011.

Translation of Office Action in Korean application 2010-7011862 corresponding to U.S. Appl. No. 11/955,201, citing KR19990081842 and KIM_BONKEE_ET_AL_A_2_6_V_GSM_PCN_year_2002 dated Apr. 29, 2011.

Wan, Jiansong, "Tunable Bandpass (1.7-6)GHz Polyphase Filter in Near Zero IF Receiver," Philips, Jul. 2007.

Zhu, Yide, "Harmonic Rejection Mixer for Digital Video Broadcase-Handheld," Thesis, Delft University of Technology, Jun. 2007.

Jau, J.K., et al., "Highly efficient multimode RF transmitter using the hybrid quadrature polar modulation scheme," Microwave Symposium Digest, 2006, IEEE MTT-S International, Nov. 20, 2006.

Taiwan Search Report—TW098140249—TIPO—Oct. 10, 2012.

\* cited by examiner (PRIOR ART)
FIG 1

LINEAR AND POLAR DUAL MODE TRANSMITTER CIRCUIT

RELATED APPLICATIONS

The present application is a continuation-in-part of U.S. patent application Ser. No. 12/209,164, entitled "Local oscillator buffer and mixer having adjustable size," filed Sep. 11, 2008, the contents of which are hereby incorporated by reference in their entirety. U.S. patent application Ser. No. 12/209,164 is a continuation-in-part of U.S. patent application Ser. No. 11/855,997, entitled "Mixer with high output power accuracy and low local oscillator leakage," filed on Sep. 14, 2007, now U.S. Pat. No. 8,019,310, issued Sep. 13, 2011, assigned to the assignee of the present application, the contents of which are hereby incorporated by reference in their entirety. U.S. patent application Ser. No. 12/209,164 is also a continuation-in-part of U.S. patent application Ser. No. 11/955,201, entitled "Local oscillator buffer and mixer having adjustable size," filed on Dec. 12, 2007, now U.S. Pat. No. 7,941,115, issued May 10, 2011, which claims priority to U.S. Provisional Patent Application Ser. No. 60/983,879, filed on Oct. 30, 2007, both assigned to the assignee of the present application, the contents of which are hereby incorporated by reference in their entirety.

TECHNICAL FIELD

The disclosure relates to integrated circuits (IC's), and more specifically, to techniques for designing a transmitter circuit capable of dual-mode linear and polar operation.

BACKGROUND

Modern wireless communications devices often support signal transmission and reception over multiple radio frequency bands, using one of several distinct communications protocols or standards. For example, a single cellular phone may communicate using any or all of the WCDMA, CDMA, GSM, EDGE, and LTE standards for cellular telephony, over any frequency bands allotted for such communications.

In a communications device, radio-frequency (RF) circuitry is typically provided to upconvert a baseband signal to a particular radio frequency band for wireless transmission. The RF circuitry supporting each frequency band and/or wireless standard typically must satisfy different design constraints. For example, for certain modulation formats, it may be advantageous to use a linear architecture for upconverting the baseband signal, e.g., in-phase and quadrature components of the baseband signal are multiplied with corresponding in-phase and quadrature components of a local oscillator signal. Alternatively, for other modulation formats, it may be advantageous to use a polar architecture for upconverting the baseband signal, e.g., a single baseband signal having real amplitude is multiplied with a local oscillator signal having variable phase.

To accommodate multiple modulation formats, it would be desirable to provide a communications device capable of operation in both linear and polar modes, while minimizing unnecessary replication of component circuitry.

SUMMARY

An aspect of the present disclosure provides a method for upconverting a baseband signal comprising: in a linear mode, mixing a baseband in-phase (BB I) signal with a local oscillator in-phase (LO I) signal using a primary mixer; in the linear mode, mixing a baseband quadrature (BB Q) signal with a local oscillator quadrature (LO Q) signal using a secondary mixer; in the linear mode, combining the outputs of the primary and secondary mixers to generate an upconverted signal; and in a polar mode, mixing a baseband amplitude (BB) signal with a phase-modulated local oscillator (LO) signal using the primary mixer.

Another aspect of the present disclosure provides an apparatus for upconverting a baseband signal comprising: a primary mixer configured to, in a linear mode, mix a baseband in-phase (BB I) signal with a local oscillator in-phase (LO I) signal, the primary mixer further configured to, in a polar mode, mix a baseband amplitude (BB) signal with a phase-modulated local oscillator (LO) signal; and a secondary mixer configured to, in the linear mode, mix a baseband quadrature (BB Q) signal with a local oscillator quadrature (LO Q) signal.

Yet another aspect of the present disclosure provides an apparatus for upconverting a baseband signal comprising: primary means for mixing a baseband in-phase (BB I) signal with a local oscillator in-phase (LO I) signal in a linear mode, and for mixing a baseband amplitude (BB) signal with a local oscillator (LO) signal in a polar mode; and secondary means for mixing a baseband quadrature (BB Q) signal with a local oscillator quadrature (LO Q) signal in the linear mode, and mixing the BB signal with the LO signal in the polar mode.

Yet another aspect of the present disclosure provides a computer program product for instructing a transmitter to upconvert a baseband signal, the transmitter comprising a primary mixer for multiplying a first baseband signal with a first local oscillator signal and a secondary mixer for multiplying a second baseband signal with a second local oscillator signal, the product comprising: computer-readable medium comprising: code for causing a computer to, in the linear mode, digitally generate a baseband in-phase signal as the first baseband signal; and code for causing a computer to, in the polar mode, digitally generate a baseband amplitude signal as the first baseband signal.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
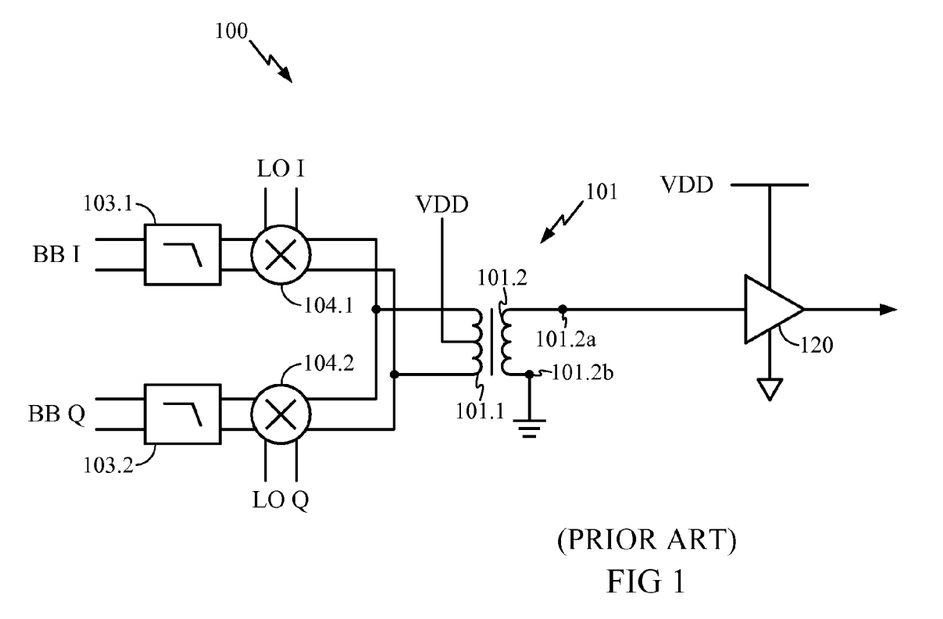
FIG. 1 depicts an implementation of a known transmitter for a communications device.

FIG. 1 depicts an implementation of a known transmitter 100 for a device. In FIG. 1, baseband input signals BB I (in-phase) and BB Q (quadrature-phase) are provided to low-pass filters 103.1 and 103.2. Both signals BB I and BB Q may be differential (rather than single-ended) signals, and, unless otherwise noted, such signals may generally be represented in the accompanying figures by the use of two signal lines rather than one. The output signals of the low-pass filters 103.1 and 103.2 are provided to mixers 104.1 and 104.2, which modulate the filtered baseband signals to a higher frequency by multiplying with differential local oscillator signals LO I and LO Q, respectively.

The differential outputs of the mixers 104.1 and 104.2 are combined and coupled to a balun primary element 101.1 of balun 101. Balun 101 also includes a balun secondary element 101.2 electromagnetically coupled to the balun primary element 101.1. The balun 101 functions to convert a differential signal across the balun primary element 101.1 to a single-ended signal at node 101.2a of the balun secondary element 101.2, wherein the other node 101.2b of the balun secondary element 101.2 is coupled to a ground voltage. In FIG. 1, the balun primary and secondary elements are shown as mutually coupled inductors, although the techniques of the present disclosure need not be limited to implementations of baluns as mutually coupled inductors.

In FIG. 1, the node 101.2a of the balun secondary element 101.2 is coupled to an amplifier 120. Such an amplifier may include a pre-driver amplifier, driver amplifier, or power amplifier, that performs the function of amplifying the signal prior to transmission over the air via an antenna (not shown).

One of ordinary skill in the art will realize that the components in the transmitter 100 are shown for illustrative purposes only, and that a transmitter may generally be implemented using any of a number of alternative architectures not shown. For example, a transmitter may omit the balun element 101, and/or adopt additional filters and gain elements not shown. The techniques of the present disclosure are contemplated to be applicable to such alternative architectures not shown.

One of ordinary skill in the art will also appreciate that the circuit blocks depicted in the accompanying figures are intended only as functional illustrations, and are not meant to depict the degree to which certain functions may be integrated with each other. For example, in certain exemplary embodiments, a single integrated circuit (IC) may be provided that implements all of the functions of the baseband filters, the mixers, and the balun, while a separate IC may be provided that implements the function of the amplifier. Alternatively, all functional components shown may be implemented discretely, or together in a single chip. Such exemplary embodiments are contemplated to fall within the scope of the present disclosure.

In modern wireless devices, a single transmitter may be designed to accommodate multiple operating frequency ranges and/or wireless standards. For example, a transmitter may be designed to accommodate frequency ranges such as 824-914 MHz (used for wireless standards such as GSM850, GSM900, JCELL), and 1710-1980 MHZ (used for wireless standards such as DCS, PCS, IMT). The transmitter may also be designed to support multiple modulation formats, e.g., Gaussian minimum-shift keying (GMSK), quadrature amplitude modulation (QAM), quadrature phase-shift keying (QPSK), etc. To accommodate multiple frequency ranges, standards, and/or modulation formats, a single transmitter architecture may be alternately configured to support either a linear mode of operation or a polar mode of operation, as further described hereinbelow.

Figure 2:
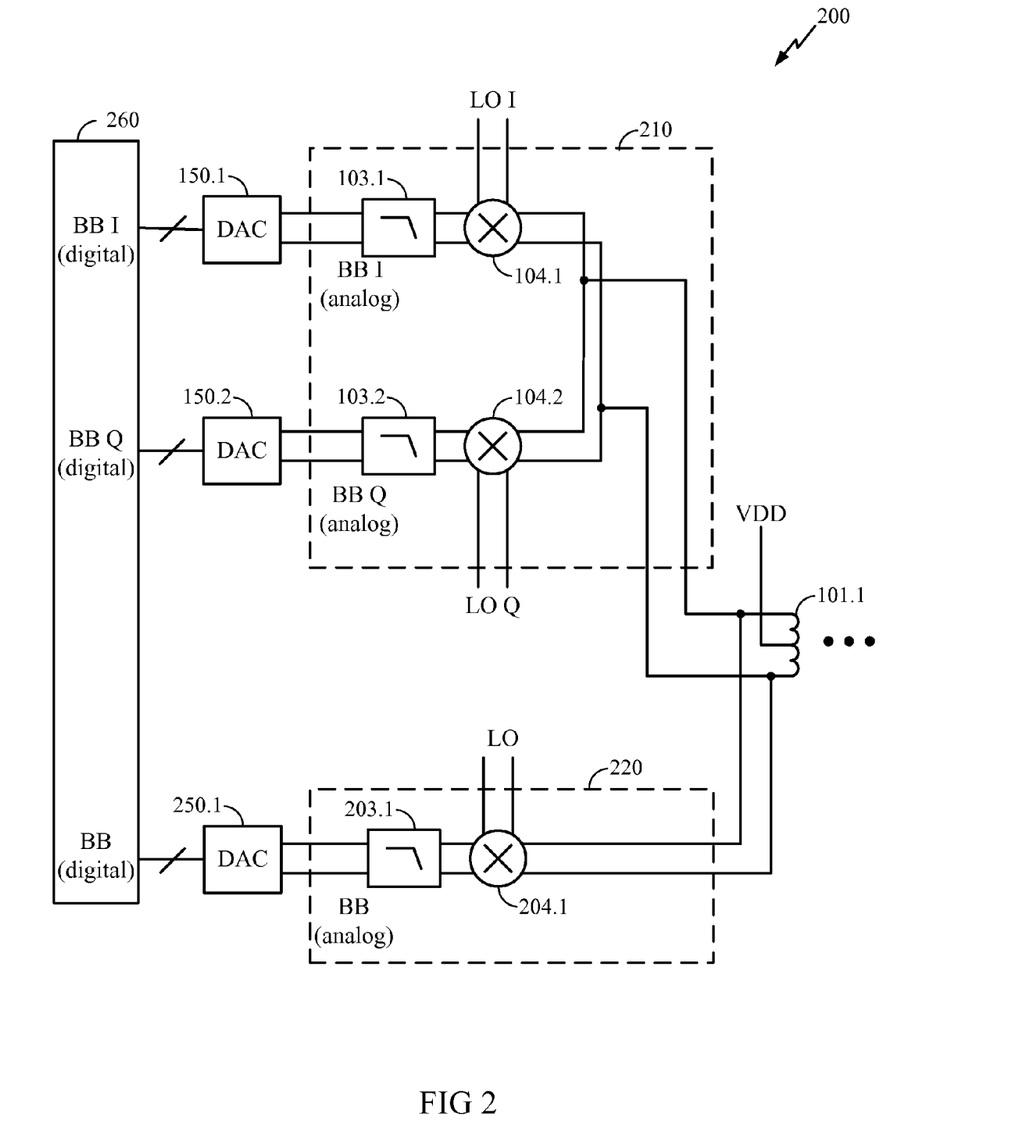
FIG. 2 depicts a transmitter supporting both linear and polar modes of operation according to the present disclosure.

FIG. 2 depicts an exemplary embodiment of a transmitter 200 supporting both linear and polar modes.

In linear mode, a baseband module 260 provides digital baseband signals BB I (digital) and BB Q (digital) to digital-to-analog converters (DAC's) 150.1 and 150.2, respectively. The DAC's 150.1 and 150.2 output analog differential baseband signals BB I (analog) and BB Q (analog) to upconversion module 210. BB I and BB Q contain the in-phase and quadrature components, respectively, of the signal to be transmitted. Within the upconversion module 210, BB I and BB Q are filtered by filters 103.1 and 103.2, respectively, and mixed with in-phase and quadrature local oscillator signals LO I and LO Q, respectively, using mixers 104.1 and 104.2. One of ordinary skill in the art will appreciate that, in linear mode, the modulated information is contained in the amplitudes of the BB I and BB Q signals.

In polar mode, the baseband module 260 provides digital baseband amplitude signal BB (digital) to DAC 250.1, which generates a single analog differential baseband signal BB (analog) for input to upconversion module 220. Within the upconversion module 220, BB (analog) is filtered by filter 203.1, and mixed with a single local oscillator signal LO using mixer 204.1. One of ordinary skill in the art will appreciate that, in polar mode, the modulated information is contained in the amplitude of the BB signal, as well as in the phase of the LO signal.

One of ordinary skill in the art will appreciate that to select between operation in linear mode and operation in polar mode, a variety of techniques may be employed. For example, in an exemplary embodiment (not shown), a switch may be provided to couple the balun 101.1 to either the output of upconversion module 210 or the output of upconversion module 220. In an alternative exemplary embodiment (not shown), one of the upconversion modules 210 and 220 may be selectively powered off and on, e.g., by a digital signal (not shown) generated by the baseband module 260. Such exemplary embodiments are contemplated to be within the scope of the present disclosure.

While the transmitter 200 depicted in FIG. 2 may support operation in either linear or polar mode, it requires separate instances of circuitry for the linear mode upconversion module 210 and the polar mode upconversion module 220. It would be desirable to provide an even more efficient transmitter implementation that minimizes the replication of component circuitry.

Figure 3:
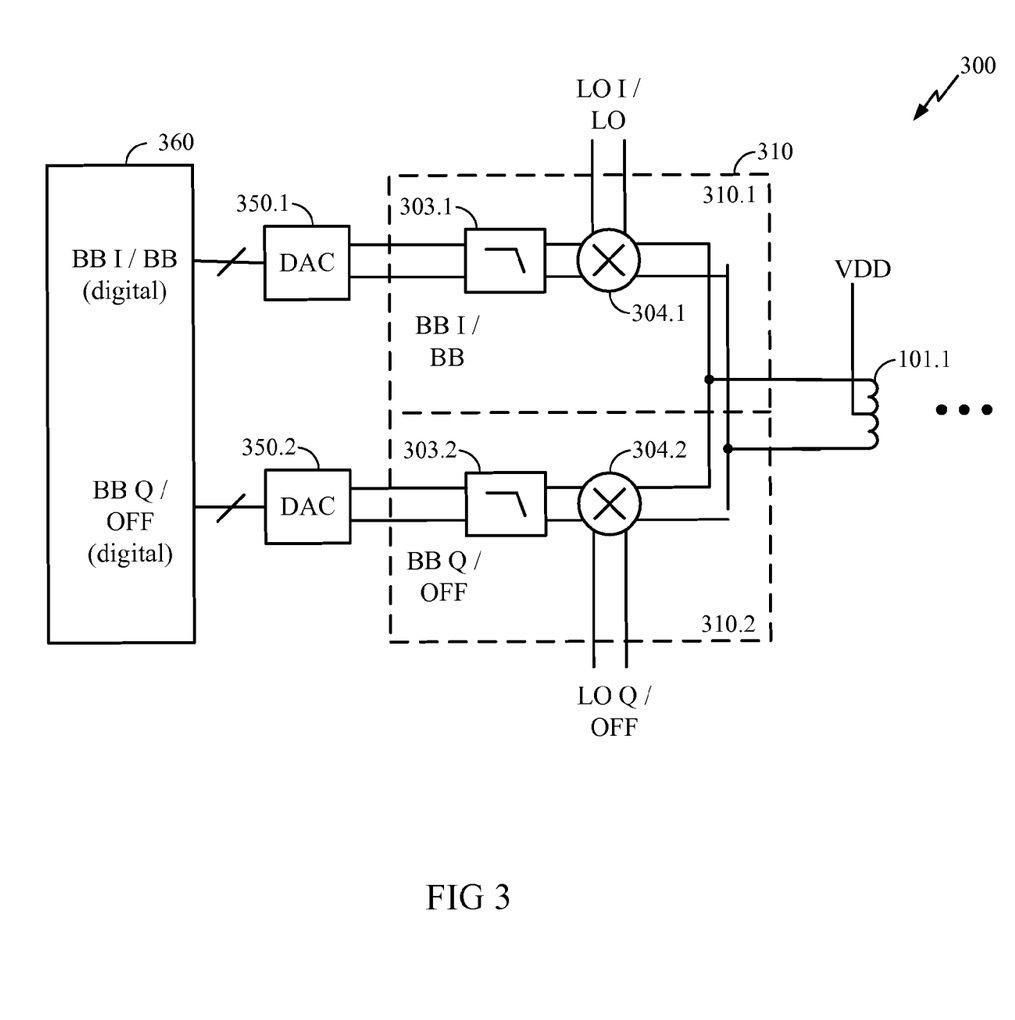
FIG. 3 depicts an exemplary embodiment of a transmitter according to the present disclosure, wherein two upconversion signal paths are provided.

FIG. 3 depicts a transmitter 300 according to the present disclosure, wherein a single upconversion module 310 is provided for both linear and polar modes. Upconversion module 310 includes two signal paths 310.1 and 310.2.

In FIG. 3, when the transmitter 300 operates in linear mode, signal path 310.1 upconverts the in-phase baseband signal BB I using the in-phase local oscillator signal LO I, while signal path 310.2 upconverts the quadrature baseband signal BB Q using the quadrature local oscillator signal LO Q.

When the transmitter 300 operates in polar mode, signal path 310.1 upconverts the baseband amplitude signal BB using the local oscillator signal LO, while signal path 310.2 is shut off.

In an exemplary embodiment, the baseband module 360 may generate BB I (digital) in linear mode, and BB (digital) in polar mode. In an alternative exemplary embodiment (not shown), digital or analog switching means may be provided to select BB I as the input to signal path 310.1 in linear mode, and to select BB as the input to signal path 310.1 in polar mode.

In an exemplary embodiment, the LO I/LO signal may be generated by a single frequency synthesizer (not shown), which can be alternately configured to generate an unmodulated local oscillator signal (LO I) during linear mode, and a modulated local oscillator signal (LO) during polar mode.

One of ordinary skill in the art will appreciate that in polar mode, the transmitter 300 effectively selects only one of the two signal paths used in linear mode, and supplies the selected signal path with the appropriate baseband and local oscillator signals for polar mode. This implementation avoids the need to provide separate upconversion modules, such as modules 210 and 220 depicted in FIG. 2, for dual mode polar and linear operation.

While the transmitter 300 avoids some of the replication of circuitry found in FIG. 2, the functionality afforded by the signal path 310.2 may also be reused during operation in polar mode. As further described herein, certain advantages may be afforded by employing in polar mode both of the signal paths used in linear mode.

Figure 4:
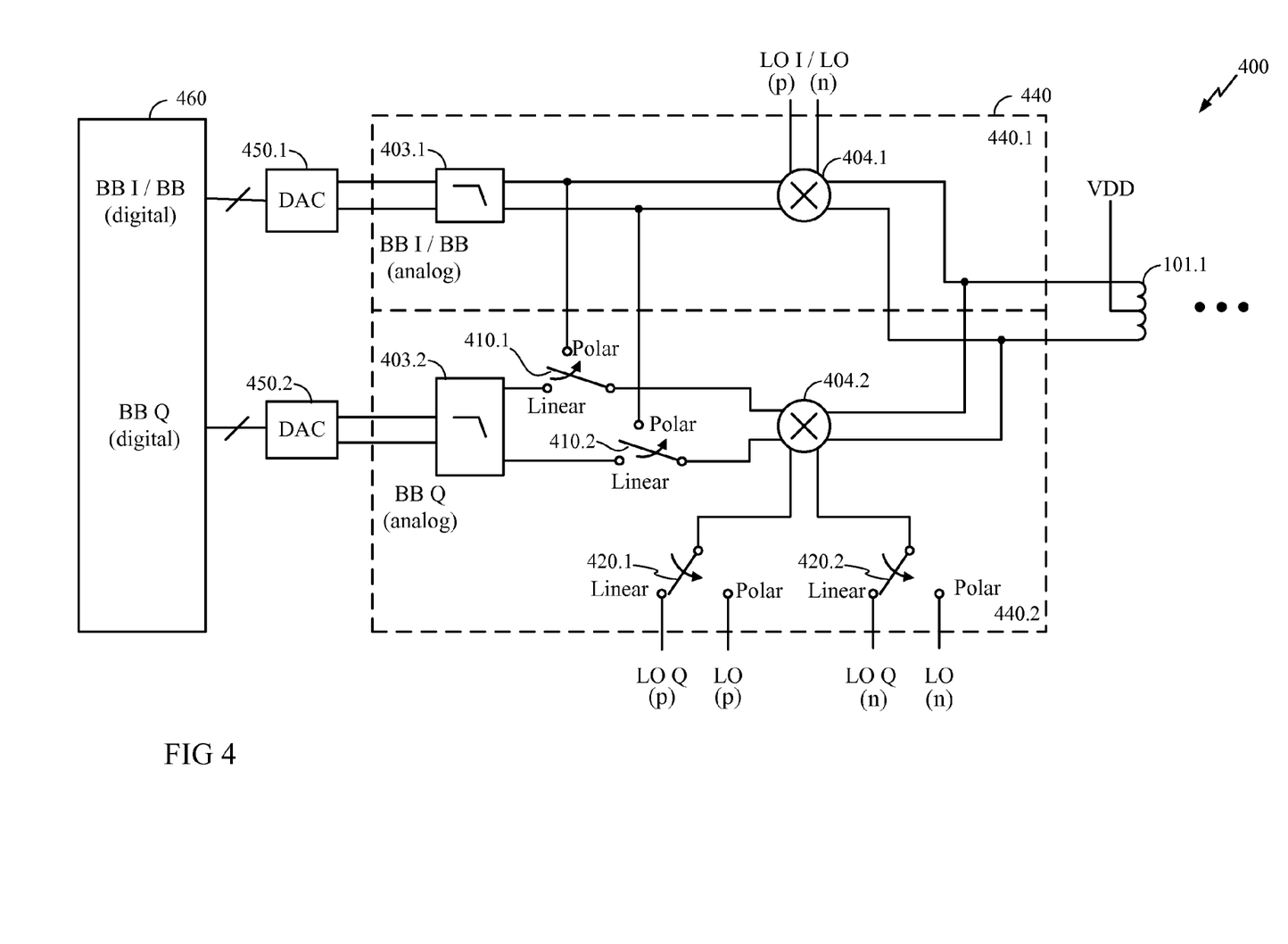
FIG. 4 depicts an exemplary embodiment of a transmitter according to the present disclosure, wherein two signal paths are provided for both linear and polar mode.

FIG. 4 depicts an exemplary embodiment of a transmitter 400 according to the present disclosure, wherein a single upconversion module 440 is designed to support both linear and polar modes. Upconversion module 440 includes first signal path 440.1 and second signal path 440.2. Switches 410.1 and 410.2 are provided to select between either linear mode or polar mode, as described hereinbelow. Switches 420.1 and 420.2 are further provided to select between operation in either linear or polar mode.

In linear mode, the first signal path 440.1 multiplies the BB I signal derived from the baseband module 460 with the LO I signal. Switches 410.1, 410.2, 420.1, and 420.2 are configured to allow the second signal path 440.2 to multiply the BB Q signal derived from the baseband module 460 with the LO Q signal, by coupling a first differential input of the mixer 404.2 to BB Q, and a second differential input of the mixer 404.2 to LO Q.

In polar mode, the baseband module 460 provides a single differential baseband signal BB to upconversion module 440. In an exemplary embodiment, the other baseband signal BB Q may be disabled in polar mode (not shown). The switches 410.1 and 410.2 are configured in polar mode to couple the differential ends of the BB signal from the first signal path 440.1 to the first differential input of mixer 404.2 in the second signal path 440.2. Furthermore, the switches 420.1 and 420.2 are configured to couple the differential ends of the LO signal to the second differential input of mixer 404.2. Using this switch configuration, the upconversion module 440 mixes the signal BB with the local oscillator signal LO using both mixers 404.1 and 404.2 in polar mode.

One of ordinary skill in the art will appreciate that alternative exemplary embodiments wherein the upconversion module 440 is designed to work with only the BB Q and LO Q signals in polar mode are also contemplated to be within the scope of the present disclosure. In fact, the designations of "I" and "Q" in this specification, in the claims, and in an arbitrary circuit design are generally interchangeable.

By employing the same two signal paths in both linear and polar mode, the architecture of transmitter 400 offers several advantages over the architectures of transmitters 200 and 300. For example, the transmitter 400 requires only two separate mixers 404.1 and 404.2, as compared to the at least three mixers 104.1, 104.2, and 204.1 required by the dual-mode transmitter 200. This leads to less die area being consumed by the transmitter 400, as well as to a simpler circuit design. Fewer mixers may also result in fewer parasitic elements loading the balun 101.1, allowing for the use of a single balun across a broad frequency range, e.g., from 800 MHz to 2 GHz.

Furthermore, compared to the transmitter 300, an advantage of the transmitter 400 is that, for equivalent levels of transmit power, each of the two signal paths 440.1 and 440.2 will consume approximately half of the total current consumed by the single mixer signal path 310.1 in polar mode. As the voltage drop across each signal path circuit element is related to the corresponding current flow in each element, the parallel-coupled signal paths 440.1 and 440.2 may require less voltage supply headroom than the single signal path 310.1 in polar mode. Thus transmitter 400 may advantageously operate with a lower voltage supply than transmitter 300. One of ordinary skill in the art will also appreciate that providing two signal paths 440.1 and 440.2 effectively doubles the available size of the mixer used for upconverting the baseband signal BB, compared to the embodiment wherein only one of the signal paths is employed.

Figure 5:
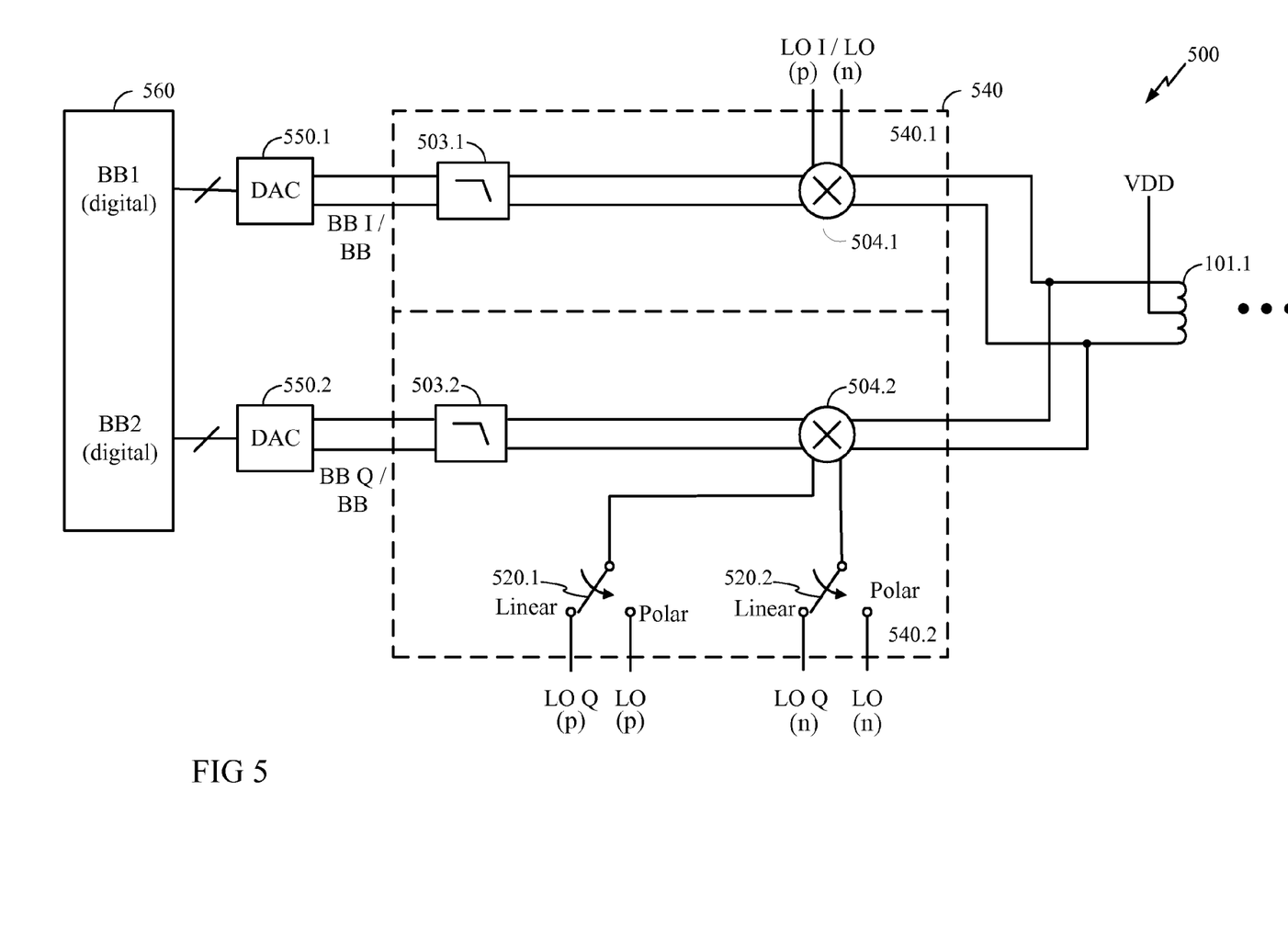
FIG. 5 depicts an exemplary embodiment of a transmitter according to the present disclosure, wherein a baseband module generates digital output signals BB1 and BB2.

FIG. 5 depicts another exemplary embodiment according to the present disclosure. In FIG. 5, a baseband module 560 generates digital output signals BB1 and BB2, which are converted to analog baseband signals BB I/BB and BB Q/BB by digital-to-analog converters 550.1 and 550.2, respectively. In linear mode, baseband module 560 provides a digital version of BB I at digital output BB1, and a digital version of BB Q at digital output BB2. In polar mode, baseband module 560 provides a digital version of BB at both digital outputs BB1 and BB2. As the baseband module 560 effectively selects the baseband input to the transmitter 500 depending on the operating mode, there is no need to perform such selection using analog switches, e.g., switches 410.1 and 410.2 in transmitter 400.

Figure 6:
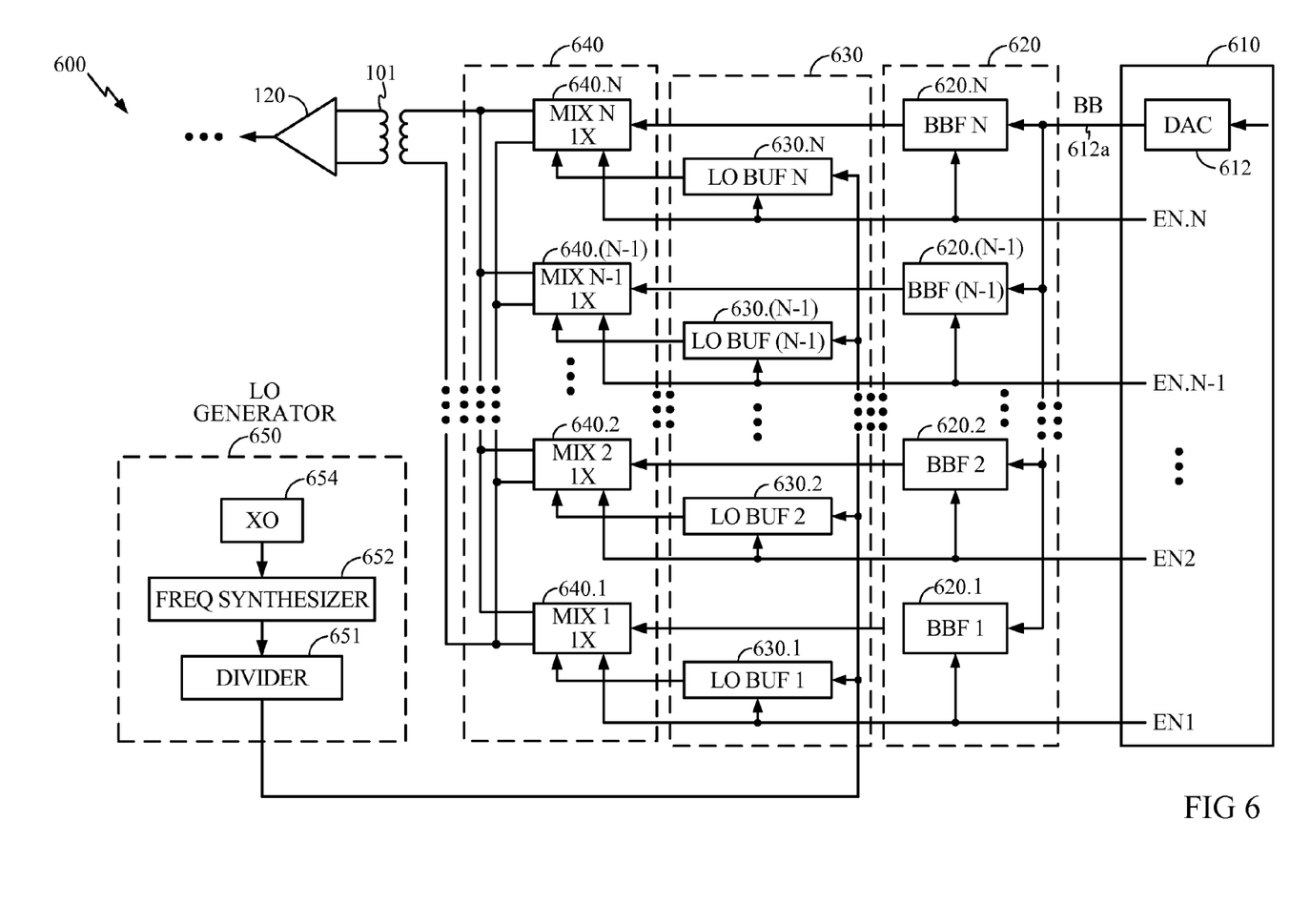
FIG. 6 depicts an exemplary embodiment of a transmitter, wherein a mixer and LO buffer having selectable size are provided to implement the techniques of the present disclosure.

FIG. 6 depicts a transmitter 600, wherein a mixer 640 and LO buffer 620 having selectable size are provided to implement the techniques of the present disclosure. Further details of a mixer and LO buffer having selectable size may be found in U.S. patent application Ser. No. 12/209,164, earlier referenced herein. In an exemplary embodiment, the scalable mixer architecture shown in mixer 640 of FIG. 6 may be used for each of the mixers 404.1 and 404.2 in transmitter 400. One of ordinary skill in the art will appreciate, however, that the mixer architecture described with reference to FIG. 6 need not be employed in the linear and polar dual mode transmitter architectures described hereinabove, and that the scope of the present disclosure is contemplated to include mixer architectures not explicitly disclosed herein. Note while the signal leads of the transmitter 600 are shown as single lines for simplicity, in FIG. 6 such single lines may generally denote either single-ended or differential-ended signals.

In the transmitter 600, mixer 640 is composed of sub-mixers 640.1 through 640.N, and LO buffer 630 is composed of associated sub-LO buffers 630.1 through 630.N. Note each of the sub-mixers 640.1 through 640.N shown may include a plurality of separate mixer circuits (not shown) including, e.g., an I mixer and an inverse I mixer for differential processing, and a Q mixer along with inverse Q mixer. Similarly, each of the sub-LO buffers 630.1 through 630.N shown may include a plurality of separate LO buffer circuits (not shown) for each of the plurality of separate mixer circuits.

In FIG. 6, the local oscillator signal is generated by an LO generator 650, which includes a frequency divider 651 coupled to the output of a frequency synthesizer 652, which is in turn coupled to a crystal oscillator 654.

In FIG. 6, the sub-mixers 640.1 through 640.N and sub-LO buffers 630.1 through 630.N may be selectively enabled or disabled by a baseband processor 610 controlling control signals EN.1 through EN.N, respectively. Each sub-mixer mixes a corresponding buffered LO signal with a baseband signal 612a derived from DAC 612 in the baseband processor 610, and filtered by selectable baseband filters 620.1 through 620.N. The mixed and combined output signals of the sub-mixers are coupled via a balun 101 to an amplifier 120 for further transmission, e.g., over an antenna (not shown).

In the transmitter 600, the baseband processor 610 may select which of the sub-mixers, sub-LO buffers, and baseband filters to enable, based on criteria including, e.g., total gain of the transmit power required to be delivered to the driver amplifier. For example, to operate in a lowest gain mode, only sub-mixer 640.1, sub-LO buffer 630.1, and baseband filter 620.1 may be enabled, with the remaining sub-mixers, sub-LO buffers, and baseband filters being disabled. This mode may correspond to operating the transmitter 600 with a mixer and LO buffer of minimum size. To operate in a highest gain mode, all of sub-mixers 640.1 through 640.N, sub-LO buffers 630.1 through 630.N, and baseband filters 620.1 through 620.N may be enabled. This mode may correspond to operating the transmitter 600 with a mixer and LO buffer of maximum size. One of ordinary skill in the art will appreciate that a mixer and LO buffer of an intermediate size may be obtained by enabling a corresponding subset of the sub-mixers and sub-LO buffers.

In an exemplary embodiment, each of the sub-mixers 640.1 through 640.N may be nominally identically sized to allow accurate control of the gain step size available to the transmitter 600.

Figure 7:
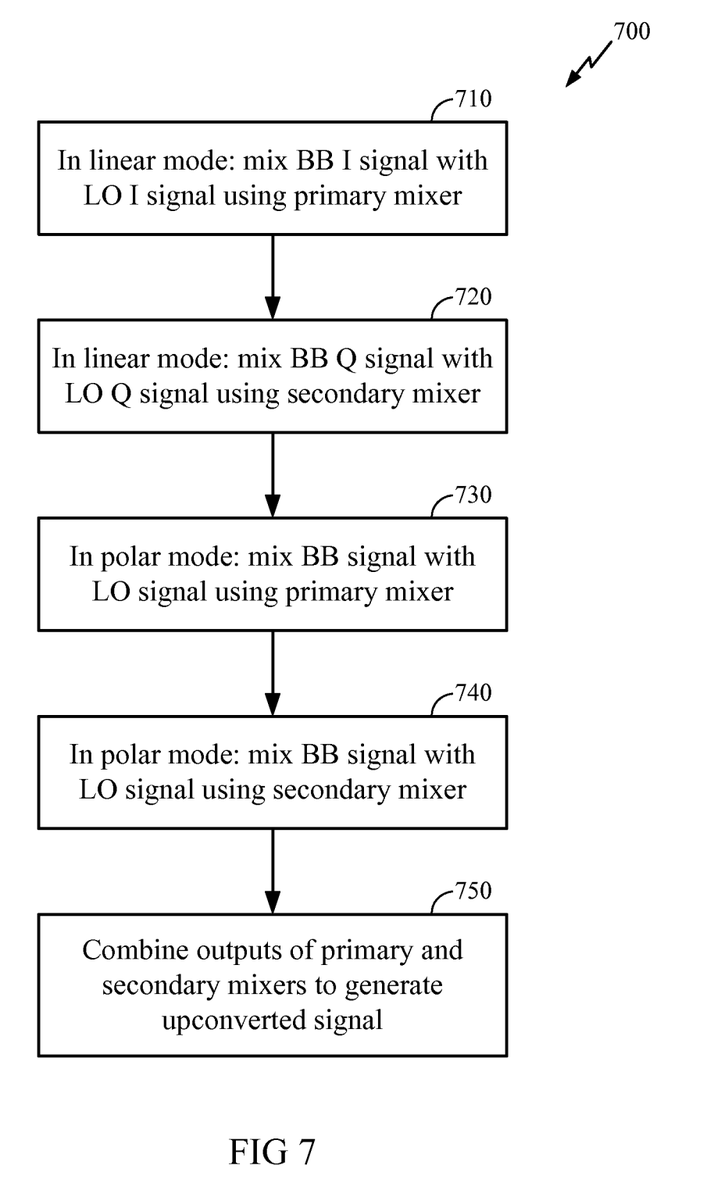
FIG. 7 depicts an exemplary embodiment of a method according to the present disclosure.

FIG. 7 depicts an exemplary embodiment of a method 700 according to the present disclosure. Note the exemplary embodiment shown in FIG. 7 is meant to be illustrative only, and is not meant to limit the scope of the present disclosure to any particular exemplary embodiment shown. Furthermore, the order of the steps shown in FIG. 7 should not be construed as limiting the techniques disclosed to any particular sequence of steps.

At step 710, in linear mode, the method mixes the baseband quadrature (BB Q) signal with the local oscillator quadrature (LO Q) signal using a primary mixer.

At step 720, in linear mode, the method mixes the baseband in-phase (BB I) signal with the local oscillator in-phase (LO I) signal using a secondary mixer.

At step 730, in polar mode, the method mixes the baseband quadrature (BB Q) signal with the local oscillator quadrature signal (LO Q) signal using the primary mixer.

At step 740, in polar mode, the method mixes the baseband quadrature (BB Q) signal with the local oscillator quadrature signal (LO Q) signal using the secondary mixer.

At step 750, the method combines the outputs of the primary and secondary mixers to generate the upconverted signal.

Based on the teachings described herein, it should be apparent that an aspect disclosed herein may be implemented independently of any other aspects and that two or more of these aspects may be combined in various ways. In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. A method for upconverting a baseband signal comprising:
    in a linear mode, mixing a baseband in-phase (BB I) signal with a local oscillator in-phase (LO I) signal using a primary mixer;
    in the linear mode, mixing a baseband quadrature (BB Q) signal with a local oscillator quadrature (LO Q) signal using a secondary mixer;
    in the linear mode, combining the outputs of the primary and secondary mixers to generate an upconverted signal;
    in a polar mode, mixing a baseband amplitude (BB) signal with a phase-modulated local oscillator (LO) signal using the primary mixer; and
    in the polar mode, mixing the BB signal with the phase-modulated LO signal using the secondary mixer;
    in the polar mode, combining the outputs of the primary and secondary mixers to generate the upconverted signal;
    the primary mixer and the secondary mixer each comprising a plurality of sub-mixers, the method further comprising selectively enabling at least one of the sub-mixers of the primary and secondary mixers to adjust gains of the primary and second mixers, respectively, in response to a required transmitter gain.

2. The method of claim 1, the mixing the BB Q signal with the LO Q signal using the secondary mixer in the linear mode comprising coupling a first differential input of the secondary mixer to the BB Q signal, and the mixing the BB signal with the LO signal using the secondary mixer in the polar mode comprising coupling the first differential input of the secondary mixer to the BB signal.

3. The method of claim 2, the coupling the first differential input of the secondary mixer to the BB Q signal and the coupling the first differential input of the secondary mixer to the BB signal comprising configuring a switch.

4. The method of claim 2, further comprising:
in the linear mode, digitally generating a digital baseband in-phase signal at a first digital output;
in the linear mode, converting the digital baseband in-phase signal at the first digital output to a first analog signal;
in the polar mode, digitally generating a digital baseband amplitude signal at the first digital output;
in the polar mode, converting the digital baseband amplitude signal at the first digital output to the first analog signal; and
coupling the first analog signal to a first differential input of the primary mixer.

5. The method of claim 4, further comprising:
in the linear mode, digitally generating a digital baseband quadrature signal at a second digital output;
in the linear mode, converting the digital baseband quadrature signal to a second analog signal;
in the polar mode, digitally generating a digital baseband amplitude signal at the second digital output;
in the polar mode, converting the digital baseband amplitude signal at the second digital output to the second analog signal; and
coupling the second analog signal to the first differential input of the secondary mixer.

6. The method of claim 2, the mixing the BB Q signal with the LO Q signal using the secondary mixer in the linear mode comprising coupling a second differential input of the secondary mixer to the LO Q signal, and the mixing the BB signal with the LO signal using the secondary mixer in the polar mode comprising coupling the second differential input of the secondary mixer to the LO signal.

7. The method of claim 6, the coupling the second differential input of the secondary mixer to the LO Q signal and the coupling the second differential input of the secondary mixer to the LO signal comprising configuring a switch.

8. The method of claim 1, the combining the outputs of the primary and secondary mixers comprising coupling differential outputs of the primary and secondary mixers to a single balun.

9. The method of claim 8, further comprising upconverting the baseband signal to a frequency range from 800 MHz to 2 GHz using the single balun.

10. The method of claim 1, wherein an input of each of the plurality of sub-mixers is coupled to a corresponding local oscillator buffer, the method further comprising selectively enabling at least one of the local oscillator buffers in response to the required transmitter gain.

11. The method of claim 1, the plurality of sub-mixers each having an identical nominal size.

12. An apparatus for upconverting a baseband signal comprising:
a primary mixer configured to, in a linear mode, mix a baseband in-phase (BB I) signal with a local oscillator in-phase (LO I) signal, the primary mixer further configured to, in a polar mode, mix a baseband amplitude (BB) signal with a phase-modulated local oscillator (LO) signal; and
a secondary mixer configured to, in the linear mode, mix a baseband quadrature (BB Q) signal with a local oscillator quadrature (LO Q) signal, the secondary mixer further configured to, in the polar mode, mix the BB signal with the phase-modulated LO signal;
the primary mixer and the secondary mixer each comprising a plurality of sub-mixers, the apparatus configured to selectively enable at least one of the sub-mixers of the primary and secondary mixers to adjust gains of the primary and second mixers, respectively, in response to a required transmitter gain;
further comprising a balun coupled to the outputs of the primary and secondary mixers.

13. The apparatus of claim 12, the secondary mixer comprising a first differential input coupled to the BB Q signal in the linear mode, and to the BB signal in the polar mode.

14. The apparatus of claim 13, further comprising a switch coupling the first differential input of the secondary mixer to the BB Q signal in the linear mode, and to the BB signal in the polar mode.

15. The apparatus of claim 13, further comprising a digital module configured to:
digitally generate a digital baseband in-phase signal at a first digital output in the linear mode;
digitally generate a digital baseband amplitude signal at the first digital output in the polar mode; the apparatus further comprising:
a first digital-to-analog converter for converting the digital baseband in-phase signal at the first digital output to a first analog signal in the linear mode and the digital baseband amplitude signal at the first digital output to the first analog signal in the polar mode;
the first analog signal coupled to a first differential input of the primary mixer.

16. The apparatus of claim 15, wherein the digital module is further configured to:
digitally generate a digital baseband quadrature signal at a second digital output in the linear mode;
digitally generate the digital baseband amplitude signal at the second digital output in the polar mode; the apparatus further comprising:
a second digital-to-analog converter for converting the digital baseband quadrature signal at the second digital output to a second analog signal in the linear mode and the digital baseband amplitude signal at the second digital output to the second analog signal in the polar mode;
the second analog signal coupled to the first differential input of the secondary mixer.

17. The apparatus of claim 13, the secondary mixer comprising a second differential input coupled to the LO Q signal in the linear mode, and to the LO signal in the polar mode.

18. The apparatus of claim 17, further comprising a switch coupling the second differential input of the secondary mixer to the LO Q signal in the linear mode, and to the LO signal in the polar mode.

19. The apparatus of claim 12, wherein the balun is configured to operate in a frequency range from 800 MHz to 2 GHz.

20. The apparatus of claim 12, wherein an input of each of the plurality of sub-mixers is coupled to a corresponding local oscillator buffer, the apparatus further configured to selectively enable at least one of the local oscillator buffers in response to the required transmitter gain.

21. The apparatus of claim 12, wherein the plurality of sub-mixers have an identical nominal size.

22. An apparatus for upconverting a baseband signal comprising:

primary means for mixing a baseband in-phase (BB I) signal with a local oscillator in-phase (LO I) signal in a linear mode, and for mixing a baseband amplitude (BB) signal with a local oscillator (LO) signal in a polar mode;

secondary means for mixing a baseband quadrature (BB Q) signal with a local oscillator quadrature (LO Q) signal in the linear mode, and mixing the BB signal with the LO signal in the polar mode;

the primary means for mixing and the secondary means for mixing each comprising a plurality of sub-means for mixing, the apparatus further comprising means for selectively enabling at least one of the sub-mixers of the primary means for mixing and secondary means for mixing to adjust gains of the primary means for mixing and secondary means for mixing, respectively, in response to a required transmitter gain; and means for combining the outputs of the primary and secondary means for mixing to generate an upconverted signal.

23. An apparatus for instructing a transmitter to upconvert a baseband signal, the transmitter comprising a primary mixer for multiplying a first baseband signal with a first local oscillator signal and a secondary mixer for multiplying a second baseband signal with a second local oscillator signal, the apparatus comprising:

non-transitory computer-readable medium comprising:

code for causing a computer to, in a linear mode, digitally generate a baseband in-phase signal as the first baseband signal;

code for causing the computer to, in a polar mode, digitally generate a baseband amplitude signal as the first baseband signal;

code for causing a computer to, in the linear mode, digitally generate a digital baseband quadrature signal as the second baseband signal;

code for causing the computer to, in the polar mode, digitally generate the baseband amplitude signal as the second baseband signal;

code for causing the computer to, in the polar mode, generate the first and second local oscillator signals as the same LO signal; and code for causing the computer to selectively enable at least one of a plurality of sub-mixers of each of the primary and secondary mixers to adjust gains of the primary and secondary mixers in response to a required transmitter gain.

* * * * *